(12) United States Patent
Krämer et al.

(10) Patent No.: US 8,112,134 B2
(45) Date of Patent: Feb. 7, 2012

(54) SUPERCONDUCTING CURRENT LIMITER DEVICE OF THE RESISTIVE TYPE HAVING A HOLDING ELEMENT

(75) Inventors: Hans-Peter Krämer, Erlangen (DE); Manfred Wohlfart, Wiesenthau (DE)

(73) Assignee: Siemens Aktiengesellschaft, Munich (DE)

( * ) Notice: Subject to any disclaimer, the term of this patent is extended or adjusted under 35 U.S.C. 154(b) by 584 days.

(21) Appl. No.: 12/374,126

(22) PCT Filed: Jun. 21, 2007

(86) PCT No.: PCT/EP2007/056217
§ 371 (c)(1),
(2), (4) Date: Jan. 16, 2009

(87) PCT Pub. No.: WO2008/009537
PCT Pub. Date: Jan. 24, 2008

(65) Prior Publication Data
US 2009/0264294 A1 Oct. 22, 2009

(30) Foreign Application Priority Data

Jul. 17, 2006 (DE) .......................... 10 2006 032 973

(51) Int. Cl.
*H01L 39/16* (2006.01)
*H02H 9/02* (2006.01)
*H01C 7/00* (2006.01)

(52) U.S. Cl. .......... 505/211; 505/210; 505/850; 361/19; 338/13; 338/32 S; 428/930; 336/207; 336/208

(58) Field of Classification Search .................. 505/210, 505/211, 230, 236–238, 430, 433, 704, 705; 335/216; 361/19; 338/32 S, 13; 174/125.1; 428/930; 336/207, 208
See application file for complete search history.

(56) References Cited

U.S. PATENT DOCUMENTS 6,522,236 B1 * 2/2003 Ries .................................. 338/13
(Continued)

FOREIGN PATENT DOCUMENTS

DE 42 34 312 4/1994
(Continued)

OTHER PUBLICATIONS

German Office Action from corresponding German Application No. 10 2006 032 973.2, Mar. 2007.
(Continued)

*Primary Examiner* — Stanley Silverman
*Assistant Examiner* — Kallambella Vijayakumar
(74) *Attorney, Agent, or Firm* — Staas & Halsey LLP

(57) ABSTRACT

The superconducting current-limiting device contains at least one coil (61), the conductive track of which is formed from at least one band-shaped superconductor (17), where a holding element (2, 41, 10, 51, 62) is located between adjacent coil windings. The holding element (2, 41, 51, 62) is constructed wider than the superconductor (17) in the axial direction of the coil (61). The holding element (2, 41, 51, 62) further includes a flat strip (11) and an undulating strip (12, 42, 52). The flat strip (11) extends essentially parallel to the band-shaped superconductor (17) at an essentially constant distance (22) therefrom. The undulating strip (12, 42, 52) extends essentially parallel to the flat strip (11), and in the longitudinal direction periodically has regions (15, 43, 53) distant from and regions (13) close to the flat strip (11). The regions (13) of the undulating strip (12, 42, 52) near to the flat strip have a mechanical connection (21) to the flat strip (11). The regions (15, 43, 53) of the undulating strip far from the flat strip have recesses (16) of such a kind that an at least approximately close-fitting mounting of the band-shaped superconductor (17) relative to the flat strip (11) is facilitated.

10 Claims, 2 Drawing Sheets

U.S. PATENT DOCUMENTS 7,760,067 B2 * 7/2010 Prusseit et al. .................. 338/13
7,981,841 B2 * 7/2011 Kramer et al. ................ 505/150

FOREIGN PATENT DOCUMENTS

| DE | 10 2004 048 646 |   | 4/2006 |
|----|-----------------|---|--------|
| EP | 444702          | * | 3/1991 |
| EP | 0 444 702       |   | 9/1991 |
| EP | 0 503 448       |   | 9/1992 |
| WO | WO 99/33122     |   | 7/1999 |
| WO | WO 2004/006345  | * | 1/2004 |
| WO | WO 2006/037741  | * | 4/2006 |

OTHER PUBLICATIONS

German language International Search Report from International Application No. PCT/EP2007/056217, Oct. 2007.

* cited by examiner

SUPERCONDUCTING CURRENT LIMITER DEVICE OF THE RESISTIVE TYPE HAVING A HOLDING ELEMENT

CROSS REFERENCE TO RELATED APPLICATIONS

This application is based on and hereby claims priority to International Application No. PCT/EP2007/056217, filed on Jun. 21, 2007, which claims priority to German Application No. 10 2006 032 973.2, the contents of which are hereby incorporated by reference.

BACKGROUND

1. Field

The embodiments discussed herein relate to a superconducting current limiter device of the resistive type, the conductive track of which is formed by at least one band-shaped superconductor, a holding element being arranged between neighboring coil turns.

2. Description of the Related Art

In order to protect electrical components, a current limiter device may be constructed by using a superconductor. A characteristic of superconductors is the property that, below a material-specific critical temperature, they can carry currents virtually without resistance so long as the current density is less than a critical current density which depends on the operating temperature. This critical current density decreases with an increasing operating temperature, and it becomes zero when the operating temperature reaches said critical temperature.

This phenomenon can be utilized in order to construct a current limiter device which, in the event that the aforementioned critical current density is exceeded, abruptly increases its electrical resistance and is heated to above the critical temperature by the ohmic losses which then occur.

In order to avoid destruction by overheating, the current must be switched off after the current limiter has been tripped. In order to resume operation, it is necessary to wait until the entire limiter has cooled again to the operating temperature. This recooling time has an essential influence on the availability of the current limiter.

By utilizing this phenomenon, it is possible to construct a circuit breaker (current limiter) which is distinguished by rapid switching times and a switching process that is nondestructive for the protective device per se. Corresponding current limiter devices are known, for example, from DE 10 2004 048 646 A1.

As a conductor track in such a current limiter, superconducting band conductors (coated conductors) are used in particular. A superconducting band conductor in this context is intended to mean a structure in which a superconducting layer, typically an oxidic high-temperature superconductor, is applied onto a normally conducting substrate metal in band form. In order to avoid inductances, the superconducting band conductor is introduced into a flat, double-wound coil. A minimum spacing needs to be maintained between neighboring coil turns, so that a refrigerant can flow through the coil. If a high-temperature superconductor (for example YBCO) is used for the superconducting band conductor, then liquid nitrogen is suitable as a refrigerant for the current limiter device.

In double-wound coils made of band conductor material, the entire voltage drop across the coil is then applied in the region of the outer radius between neighboring conductor tracks. In order to allow a maximally compact design of the superconducting current limiter device, it is desirable to accommodate neighboring conductor turns in as small a space as possible. Consequently, the best possible insulation between neighboring turns is required in order to protect from electrical sparkover. At the same time, the availability of the superconducting current limiter device is crucially influenced by the recooling time of the superconductor after the switching process. Good accessibility of the refrigerant to the conductor track of the current limiter is consequently desirable. A superconducting current limiter device should furthermore be distinguished by the lowest possible inductance. To this end, it is advantageous that neighboring turns in the axial direction of the coil should ideally lie on a common plane surface, if possible. To this end, exact positioning of the turns of the superconducting current limiter is desirable.

SUMMARY

It is therefore an aspect of the embodiments to provide a superconducting current limiter device of the resistive type, which constitutes an improvement in respect of the technical problems mentioned above. Accordingly, a special superconducting current limiter device of the resistive type is to be provided, the conductive track of which is formed by a band-shaped superconductor.

A holding element should be arranged between neighboring coil turns. This holding element should be designed to be wider than the band-shaped superconductor in the axial direction of the coil and include of a flat band and a corrugated band. The flat band should extend parallel to the band-shaped superconductor with an essentially constant spacing. The flat band is at least substantially not corrugated. The corrugated band should extend essentially parallel to the flat band, the corrugated band having regions away from the flat band and regions close to the flat band periodically in its longitudinal direction. The regions of the corrugated band which lie close to the flat band should have a mechanical connection to the flat band. The regions of the corrugated band which lie away from the flat band should have recesses so as to allow at least approximately tight-fit reception of the band-shaped superconductor at a distance from the flat band.

The following advantages are associated with the measures according to the embodiments: the holding element, including the flat band and the corrugated band, is designed to be wider than the band-shaped superconductor in the axial direction. In this way, the electrical breakdown path from one superconducting turn to the next is lengthened in comparison with a version in which the holding element has the same width as the band-shaped superconductor. Advantageously, a compact design of the current limiter device is thereby achieved with a simultaneous improvement in the protection from voltage sparkover. A configuration of the holding device, including a flat band and a corrugated band, can furthermore achieve a high permeability of the coil for a refrigerant cooling the band-shaped superconductor. In this way, the recooling time of the superconducting band conductor can be minimized. The superconducting band conductor should be received at least approximately with a tight fit by recesses of the corrugated band. In this way, it is possible to fix the superconducting band conductor in the axial direction of the coil. This fixing contributes to minimizing the inductance of the coil. Exact axial positioning of the turns of the coil will minimize both the inductance of the coil and the Lorentz forces acting between neighboring turns. Advantageously, it is thereby possible to minimize both mechanical loads which act on the optionally provided supporting elements of the turn, and the total inductance of the superconducting current limiter devices.

The superconducting current limiter device may additionally have the following features:

The coil of the current limit device should be configured as a double-wound coil. In a double-wound coil, the inductances of the two halves of the double winding compensate for one another. In this way, a compact design with minimized inductance can advantageously be achieved for a current limiter.

An electrical insulator can be provided as the material for the flat band and/or the corrugated band. Advantageously, by using an electrically insulating material for at least parts of the holding device, the risk of electrical sparkover between the individual turns of the coil can be minimized.

A plastic can be provided as the electrical insulator. Advantageously, a plastic acts as an electrical insulator and also prevents a low thermal load during the process of cooling the current limiter device owing to its comparatively low heat capacity.

The corrugated band may essentially be designed trapezoidally, in a sawtooth shape or sinusoidally. Advantageously, a trapezoidal configuration of the corrugated band has mechanically stable guiding of the superconducting band conductor in the radial direction. A sawtooth-shaped or sinusoidal configuration of the corrugated band is simple particularly in relation to its production, and is therefore advantageous.

HTS material (oxidic high-temperature superconductor material) or LTS material (metallic low-temperature superconductor material) can be provided as the superconducting material of the band-shaped superconductor. Through the use of oxidic high-temperature superconductor material, liquid nitrogen can advantageously be used as a refrigerant for cooling the superconducting current limiter device. Metallic low-temperature superconductor material has a high mechanical load-bearing capacity and can consequently be processed well. A high mechanical strength furthermore leads to a low susceptibility of the superconducting current limiter device to faults.

The band-shaped superconductor should be formed by a layer of oxidic superconductor material of the $Ab_2Cu_3O_x$ type applied onto a buffer layer or interlayer, which is itself applied onto a metallic substrate band, where A is at least one rare earth metal inclusive of yttrium and B is at least one alkaline-earth metal. The use of a second-generation superconducting band conductor based on yttrium-barium-copper oxide in a superconducting current limiter device is advantageous both in terms of processing the second-generation band-shaped superconductor, which is furthermore readily available commercially, and in terms of the switching process of the superconducting current limiter device.

In the coil, the band-shaped superconductor cab be expediently arranged with its substrate side outward. A superconducting layer applied on a metallic substrate band typically has a higher mechanical load-bearing capacity for compressive stresses than for tensile stresses. By winding the superconducting band conductor with the substrate side outward, i.e. with the coated side inward, the superconducting layer is preferentially exposed to compressive stresses. In this way, it is advantageously possible to reduce cracking inside the superconducting layer which destroys the superconducting properties. This leads to improved reliability of the current limiter device.

The band-shaped superconductor and the holding element may be adhesively bonded to one another by means of a synthetic resin while keeping refrigerant paths free. Advantageously, better fixing of the band conductor on the holding element is achieved by adhesively bonding the superconducting band conductor to the holding element. In this way, it is possible to minimize the inductance of the overall coil, or the Lorentz forces acting between neighboring turns of the coil.

The holding element should be configured so that the mutual spacing between the superconducting turns is at least 1 mm. Advantageously, when this minimum spacing is complied with, refrigerant boiling in the event of a switching process can escape between the individual turns of the coil without exerting an unnecessarily large mechanical load on the supporting structure of the coil. Furthermore, compliance with this minimum spacing ensures a sufficient refrigerant supply for the superconducting band conductor.

BRIEF DESCRIPTION OF THE DRAWINGS

These and other aspects and advantages will become more apparent and more readily appreciated from the following description of the exemplary embodiments, taken in conjunction with the accompanying drawings of which.

Figure 1:
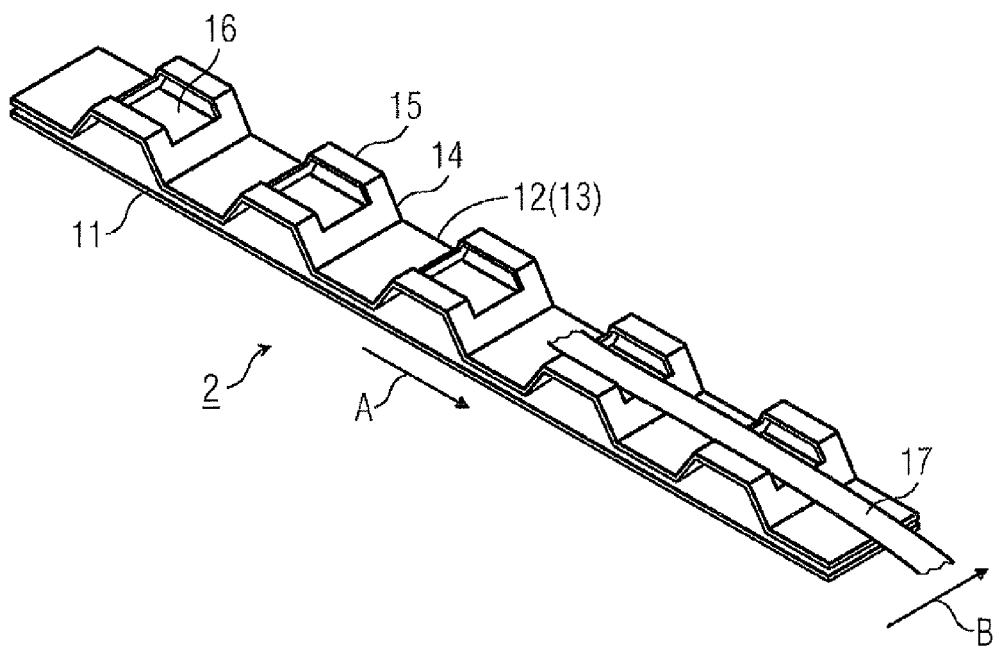
FIG. 1 shows a holding element and the superconducting band conductor fitted therein in an oblique view, the holding element being configured trapezoidally.

In the figures, parts which correspond to one another are provided with the same references.

DETAILED DESCRIPTION OF THE PREFERRED EMBODIMENT

Reference will now be made in detail to the preferred embodiments, examples of which are illustrated in the accompanying drawings, wherein like reference numerals refer to like elements throughout.

FIG. 1 shows a holding element, denoted overall by 2, including a non-corrugated flat band 11 and a trapezoidally configured corrugated band 12. The trapezoidally configured i.e. corrugated band 12 thus has regions 13 close to the flat band 11 and regions 15 away from the flat band 11. The regions (13 and 15, respectively) close to and away from the flat band are connected to one another by connection or transition pieces 14. Regions (13 and 15) of the corrugated band 12 of the holding element 2 represented in FIG. 1, which respectively lie close to and away from the flat band 11, are intended to comprise not only the surfaces respectively denoted by 13 and 15 of the trapezia but also corresponding parts, adjoining these surfaces, of the connection elements 14. The parts 15 of the corrugated band 12, which lie away from the flat band 11, have recesses 16 in the longitudinal direction of the corrugated band 12. These are configured so that a superconducting band conductor 17 comes to lie in them at least approximately with a tight fit.

In relation to the use of a holding element, represented in FIG. 1 and the denoted overall by 2, in a coil of a superconducting current limiter device, the direction denoted by B in FIG. 1 is the axial direction of the coil and the direction denoted by A is a tangential direction of the coil. The current limiter device may comprise one coil, or several coils which are arranged successively in the axial direction B. The individual coils of such a current limiter device may be configured as singly wound or preferably double-wound coils.

The holding element, denoted overall by 2, may be made from various suitable materials. Advantageously, the flat band 11 and the corrugated band 12 may consist of the same material or different material. For example, both components may be made of a plastic. For reasons of mechanical stabilization, the superconducting band conductor 17 may be mechanically connected to the corrugated band 12. Adhesive bonding of the band conductor 17 to the corrugated band 12 in the region of the contact surfaces is advantageous, or alternatively connection by means of soldering or welding spots or beads. In a configuration of the holding element 2 for which two different materials are used, the flat band 11 can absorb mechanical loads which occur both in the direction denoted by A and in the direction denoted by B. The band 12 also acts as an electrical insulator.

Such a configuration of the holding element 2 is furthermore advantageous because the holding element has a greater extent in the axial direction of the coil (denoted by B in FIG. 1) than does the superconducting band conductor 17. This significantly lengthens the path for possible electrical sparkover from one coil turn to the next, compared with a holding element 2 which has the same width as the superconducting band conductor 17 in the direction B. This reduces the risk of undesired electrical sparkover between the turns of the coil.

Exact positioning of the recesses 16 in the direction B ensures exact positioning of the band conductor 17 in this direction. Such positioning of the band conductor 17 in turn makes it possible to minimize the inductance of the coil. If the coil is configured as a double-wound coil, then such exact positioning allows improved compensation of the magnetic inductances between the two parts of the double winding. The Lorentz forces between neighboring turns can thereby be minimized as a result of exact positionability in the direction B.

Figure 2:
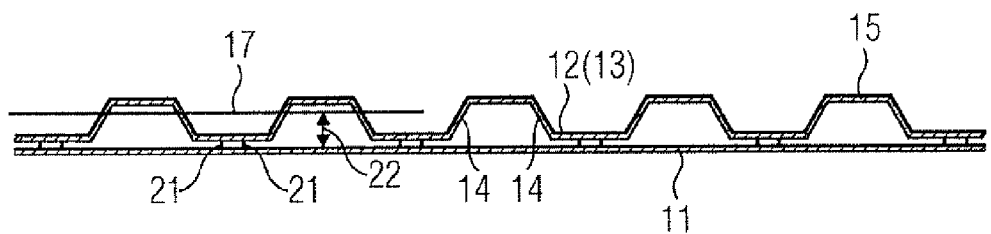
FIG. 2 shows a longitudinal section through the trapezoidally shaped holding element according to FIG. 1.

FIG. 2 shows a longitudinal section through the holding element 2 shown in FIG. 1. According to this exemplary embodiment the band-shaped superconductor 17, held by the corrugated band 12, lies at an essentially constant distance 22 from the flat band 11. The corrugated band 12 is connected to the flat band 11 through connection elements 21. The connection elements 21 may advantageously be configured as bars, welding spots, adhesive spots or the like.

Figure 3:
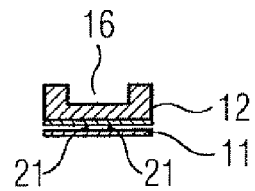
FIG. 3 shows a cross section through the trapezoidally shaped holding element according to FIG. 1.

FIG. 3 shows a cross section through the holding element 2 according to the preferred embodiment shown in FIG. 1. Both the flat band 11 and the corrugated band 12, which has a recess 16, are represented. The flat band 11 and the corrugated band 12 are connected to one another through the connection elements 21. The embodiment of the connection elements 21 is not restricted here to a point connection of the flat band 11 and the corrugated band 12; partially two-dimensional connection between the elements 11 and 12 may advantageously be produced.

Figure 4:
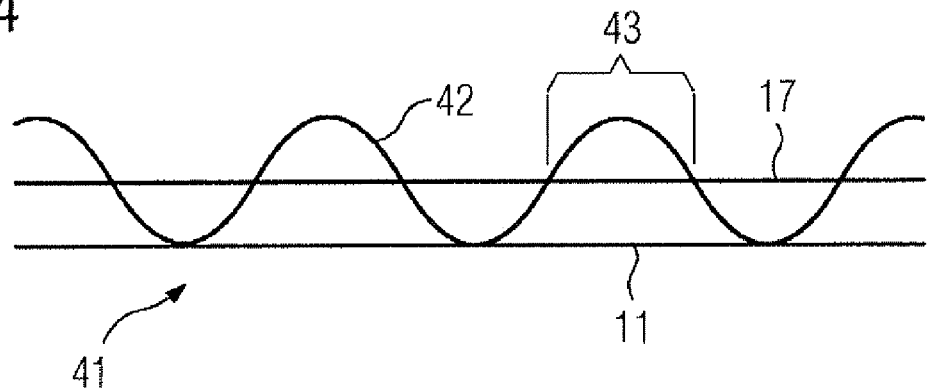
FIG. 4 shows a longitudinal section through a sinusoidally shaped holding element.

FIG. 4 shows another preferred exemplary embodiment of a holding element 41 of a superconducting current limiter device, represented in a longitudinal section. According to this exemplary embodiment, the corrugated band 42 is configured sinusoidally and has recesses, for receiving the superconducting band conductor 17, in the subregions 43 lying away from the flat band 11.

Figure 5:
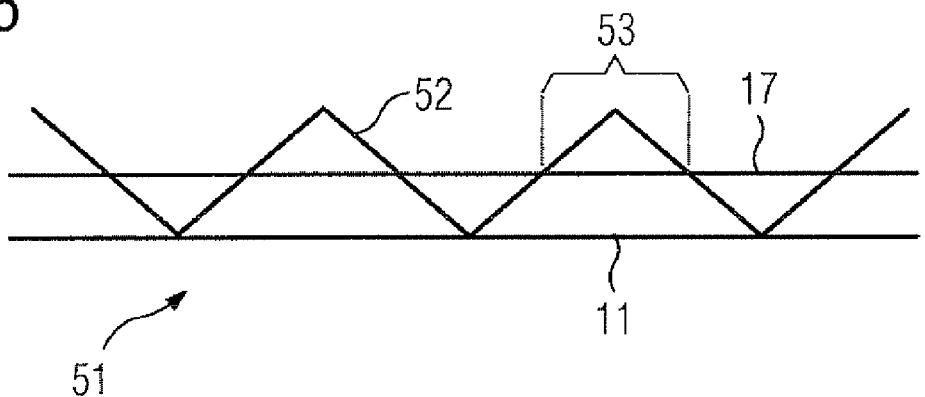
FIG. 5 shows a longitudinal section through a holding element in which the corrugated band is configured with a sawtooth shape.

According to another preferred exemplary embodiment of a holding element 51, which is represented in FIG. 5, the corrugated band 52 may be designed in a sawtooth shape, particularly in the form of a periodic triangular structure. According to this exemplary embodiment the corrugated band 52 has recesses, for receiving the superconducting band conductor 171 in the regions 53 lying away from the flat band 11.

Other geometrical configuration shapes of the corrugated band 12, 42, 52, which are not explicitly represented in the figures mentioned above but may be obtained for example from a combination of the shapes represented, may likewise advantageously be produced.

Figure 6:
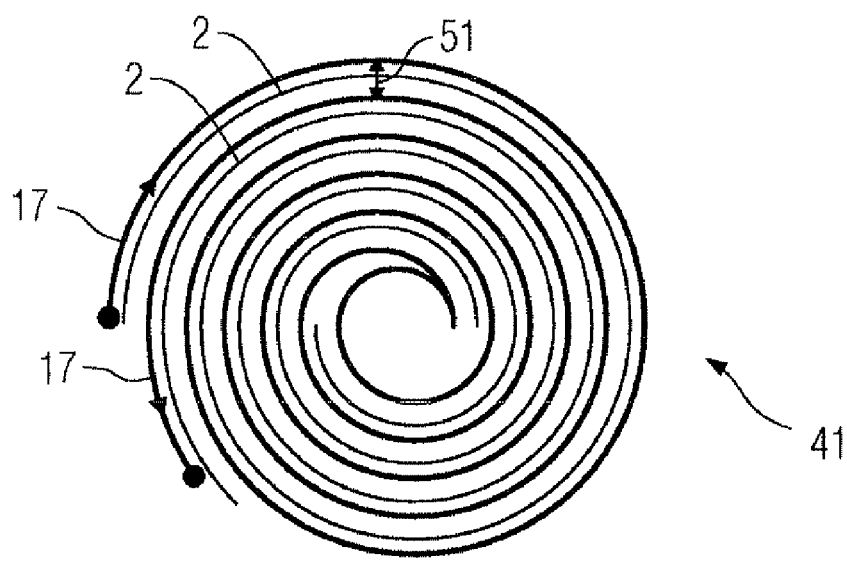
FIG. 6 shows a plan view of a double-wound disk coil of a current limiter device.

FIG. 6 shows the double-wound structure of a disk coil 61 according to a preferred exemplary embodiment of the superconducting current limiter device. The double-wound superconducting band conductor 17 is represented, as well as a holding element 2 arranged between the turns. This holding element 2 may be configured according to one of the figures mentioned above.

According to a preferred exemplary embodiment the superconducting band conductor 17 may be wound with the superconducting layer toward the inside of the coil, since oxidic high-temperature superconductor layers can be loaded more strongly in compression than in tension.

The superconducting band conductor 17 may furthermore be constructed as follows.

A so-called buffer layer may initially be applied on a metallic substrate band, the actual superconducting oxidic high-temperature superconductor (for example YBCO) being applied onto the buffer layer. The structure of such band conductor is suitable for superconducting current limiter devices proposed, for example, in DE 10 2004 048 646 A1. The overall mechanical structure of the turns of the coil must be sufficiently stable mechanically, i.e. it must be handleable during assembly and must readily absorb the forces which occur when the refrigerant boils, Here the spacing 63 of the conductor turns 17, which depends on the dimensioning of the holding element 62, has an influence on the forces which occur when the refrigerant boils (cf. FIG. 6). With reference to the holding element 2 represented in FIG. 2, this spacing is determined in particular by the distance 22 of the superconducting band conductor 17 from the flat band 11, as well as the overall height 23 of the holding element.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A superconducting current limiter device of a resistive type, comprising:
   at least one coil whose conductive track is formed by at least one band-shaped superconductor having an axial direction and comprising neighboring coil turns; and
   a holding element being arranged between the neighboring coil turns, which holding element is designed to be wider than the superconductor in the axial direction of the coil and comprises a flat band and a corrugated band , and wherein the flat band extends parallel to the band-shaped superconductor with an essentially constant spacing and comprises a longitudinal direction, the corrugated band extends essentially parallel to the flat band, the corrugated band having first regions away from the flat band and second regions close to the flat band periodically in the longitudinal direction, the second regions of the corrugated band which lie close to the flat band having a mechanical connection to the flat band, and the first regions of the corrugated band which lie away from the flat band having recesses so as to allow at least approximately tight-fit reception of the band-shaped superconductor (at a distance from the flat band.

2. The superconducting current limiter device as claimed in claim 1, wherein a double winding of the superconductor is provided for the coil.

3. The superconducting current limiter device as claimed in claim 1, wherein an electrical insulator is provided as a material for the flat band and/or the corrugated band.

4. The superconducting current limiter device as claimed in claim 3, wherein the electrical insulator comprises a plastic.

5. The superconducting current limiter device as claimed in claim 1, wherein the corrugated band is essentially designed trapezoidally, in a sawtooth shape or sinusoidally.

6. The superconducting current limiter device as claimed in claim 1, wherein an HTS material or an LTS material is provided as a superconducting material of the band-shaped superconductor.

7. The superconducting current limiter device as claimed in claim 6, wherein the band-shaped superconductor is formed by a layer of oxidic superconductor material of the $AB_2Cu_3O_x$ type applied onto a buffer or interlayer, which is itself applied onto a metallic substrate band, where A is at least one rare earth metal inclusive of yttrium and B is at least one alkaline-earth metal.

8. The superconducting current limiter device as claimed in claim 1, wherein the band-shaped superconductor is arranged with a substrate side outward in the coil.

9. The superconducting current limiter device as claimed in claim 1, wherein the band-shaped superconductor and the holding element are adhesively bonded to one another by means of a synthetic resin while keeping refrigerant paths free.

10. The superconducting current limiter device as claimed in claim 1, wherein the holding element is configured so that a mutual spacing between the superconducting turns is at least 1 mm.

* * * * *